United States Patent
Lahner et al.

(10) Patent No.: US 7,086,015 B2
(45) Date of Patent: Aug. 1, 2006

(54) METHOD OF OPTIMIZING RTL CODE FOR MULTIPLEX STRUCTURES

(75) Inventors: Juergen Lahner, Sunnyvale, CA (US); Kiran Atkmakuri, Sunnyvale, CA (US); Kavitha Chaturvedula, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 162 days.

(21) Appl. No.: 10/844,664

(22) Filed: May 12, 2004

(65) Prior Publication Data

US 2005/0257180 A1    Nov. 17, 2005

(51) Int. Cl.
*G06F 17/50* (2006.01)

(52) U.S. Cl. .................. 716/2; 716/3; 716/4; 716/7; 716/8; 716/12; 716/13; 716/14

(58) Field of Classification Search .............. 716/2, 716/3, 4, 7, 12, 13, 14, 8
See application file for complete search history.

(56) References Cited

U.S. PATENT DOCUMENTS

| | | | |
|---|---|---|---|
| 6,438,735 B1 * | 8/2002 | McElvain et al. | 716/7 |
| 2003/0149954 A1 * | 8/2003 | McElvain et al. | 716/18 |
| 2005/0268258 A1 * | 12/2005 | Decker | 716/4 |

* cited by examiner

*Primary Examiner*—Sun James Lin
(74) *Attorney, Agent, or Firm*—Westman, Champlin & Kelly, P.A.

(57) ABSTRACT

A method and computer program are disclosed for optimizing RTL code for an integrated circuit design that include steps of: (a) receiving as input a first register transfer level code for an integrated circuit design; (b) receiving as input a user defined optimum multiplex structure; (c) analyzing the first register transfer level code to identify a critical multiplex structure; (d) partitioning the global multiplex structure into local multiplex structures each identical to the user defined optimum multiplex structure; and (e) generating as output a second register transfer level code for the integrated circuit design that replaces the global multiplex structure with the local multiplex structures.

6 Claims, 12 Drawing Sheets

```
module E { bus1,bus3,sel1, out ...}
input [15:0] bus1,bus3;
input sel1;
output [15:0 ] out;

always @ ( bus1 or bus3 or sel )       ← 400
begin
case (sel)
0: out<= bus1;
1: out<= bus3;
endcase end endmodule module A ( bus1, bus2 ....sel0);
output [15:0] bus1;
input [15:0] bus2;

reg [15:0] bus1;
wire [15:0] bus_temp;
I u ( .. bus(bus_temp) )
case (sel0)
0: bus1 <= bus_temp;
1: bus1<= bus2;
endcase
..
endmodule module B (bus2 .....)

output [15:0] bus2;

I u ( .. bus(bus2).. )
endmodule module C ( bus3, bus4, sel0 ....);
output [15:0] bus3;
input [15:0] bus4;
reg [15:0] bus3;
wire [15:0] bus_temp;
I u ( .. bus(bus_temp).. )
..
case (sel0)
0: bus3 <= bus_temp;
1: bus3<= bus4;
endmodule module D ( bus4 ....);
output [15:0] bus4;

I u ( .. bus(bus4).. )
..
endmodule
```

FIG._4

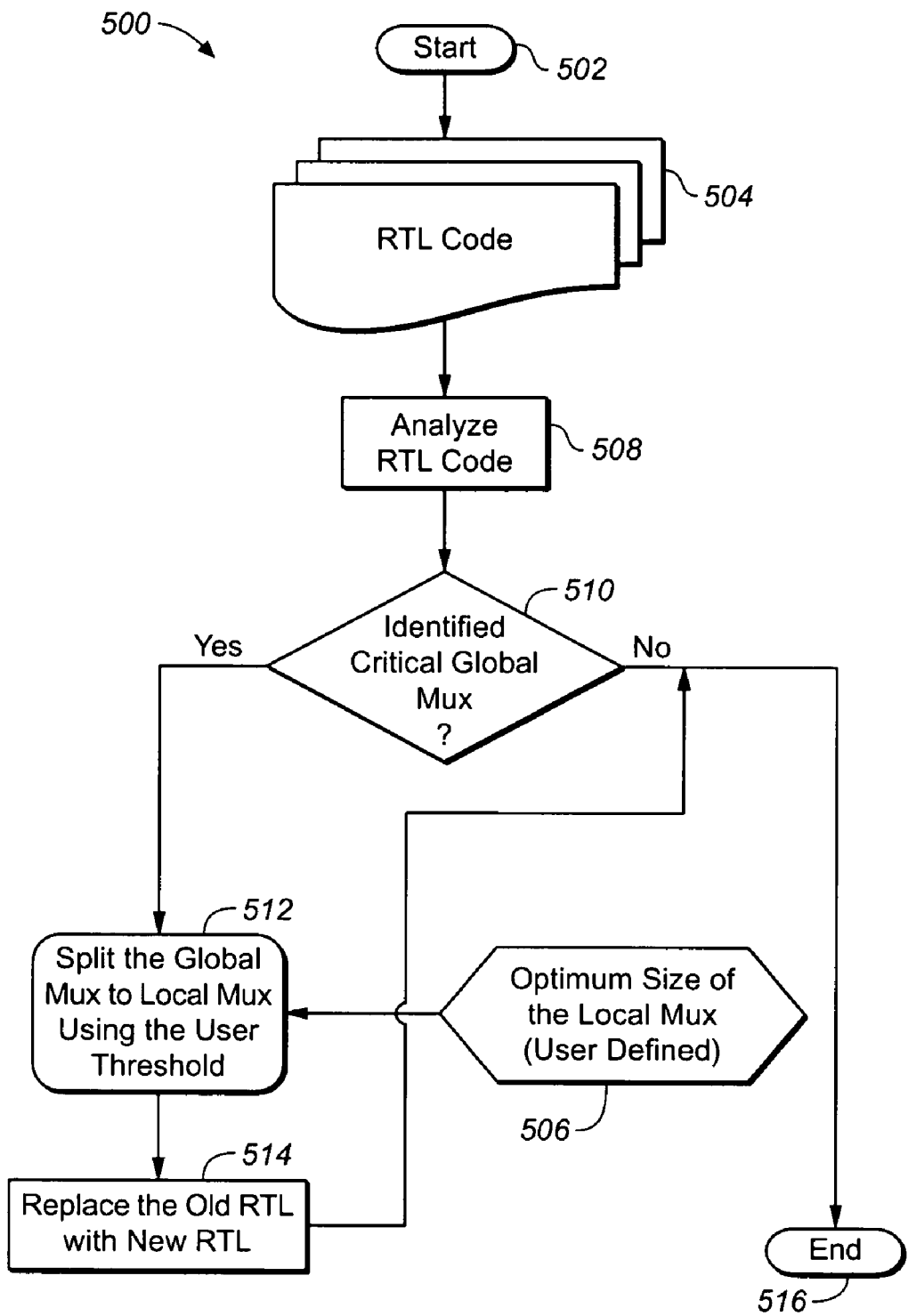
FIG._5

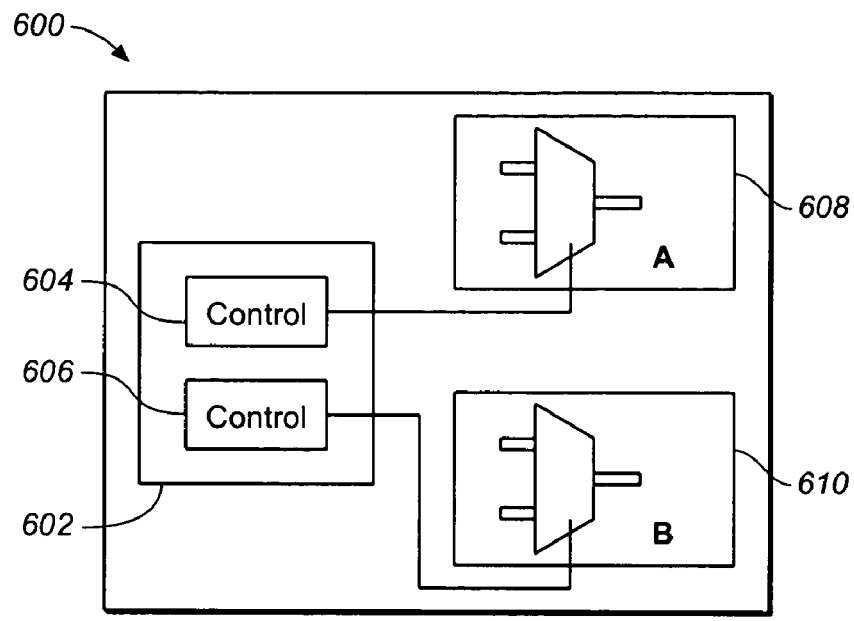
FIG._6
```
module main_control (
control_in1, control_in2,
control_out1, control_out2);
input control_in1, control_in2;
output control_out1, control_out2;
control c1 ( control_in1, control_out1)
control c2 ( control_in2, control_out2)
endmodule
module top ( ..............)
main_control C (control_in1, control_in2,
control_out1, control_out2)
A instA ( control_out1, x, y, z ,f )
B instB (control_out2, x1 y1,z1, f1)
endmodule
```
⟵ 700
FIG._7

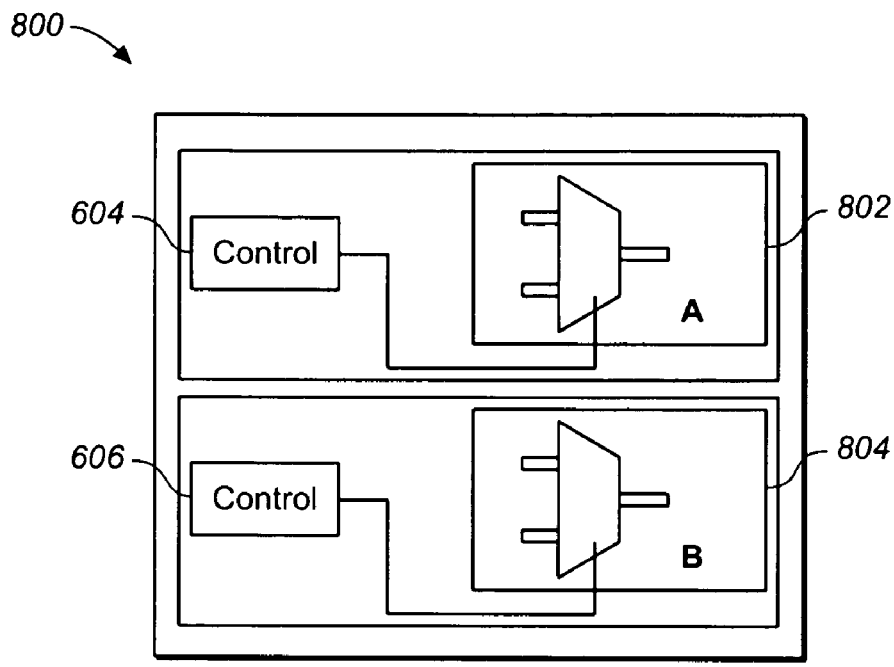
FIG._8
module top (.........)
NewA instA ( control_in1, x,y,z,f)
NewB  instB  ( control_in2, x, y, z, f)
endmodule
module NewA (control_in1, x,y,z,f)
control c1 ( control_in1, control_out1)
A  instA    ( control_out1, x, y, z ,f )
endmodule
module NewB   ( control_in2, x, y, z, f)
control c2 ( control_in2, control_out2)
B  instB    ( control_out2, x, y, z ,f )
endmodule
FIG._9

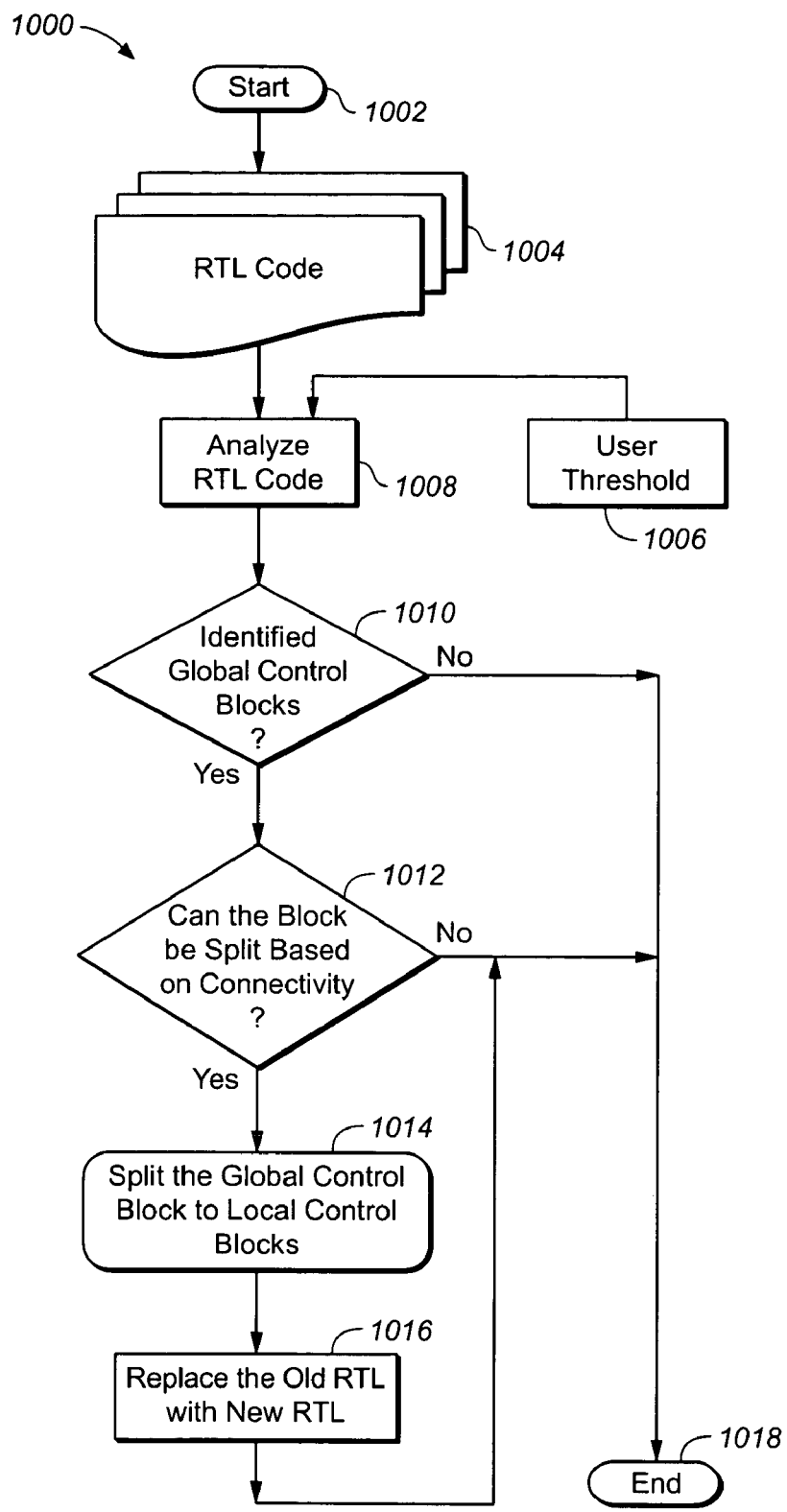
FIG._10

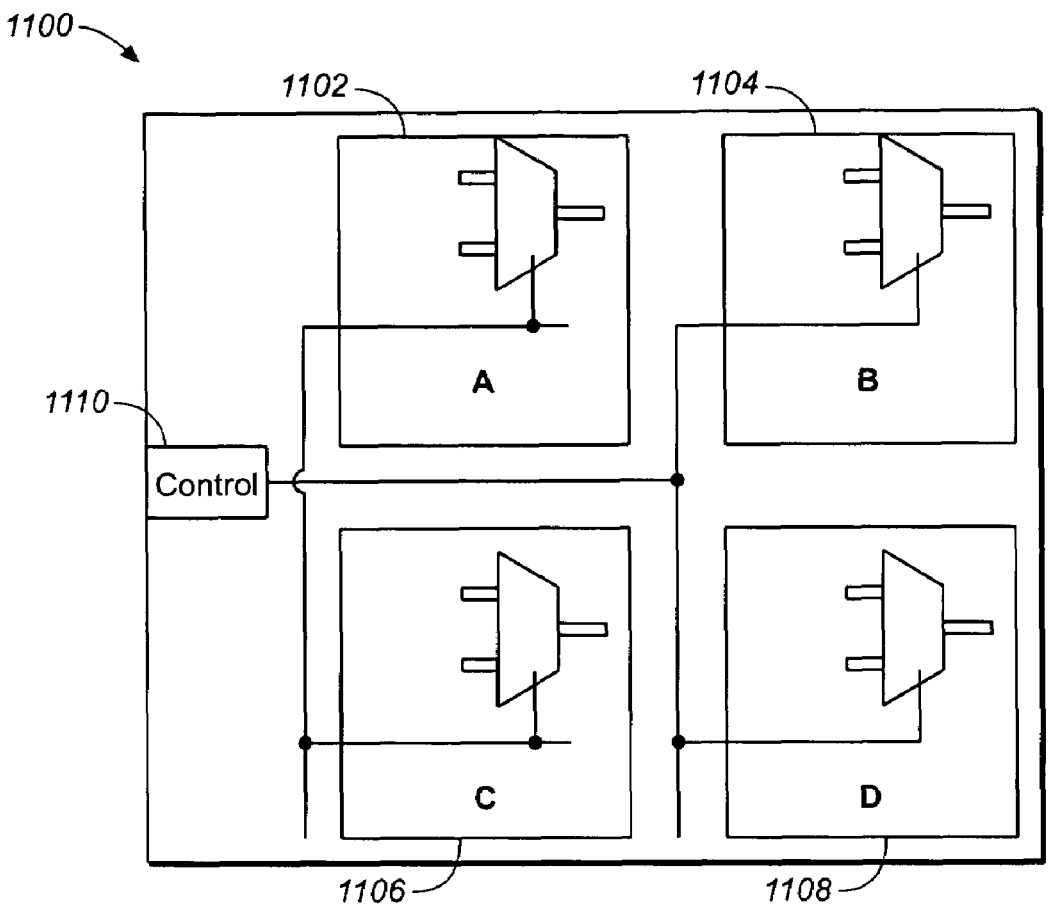
FIG._11
```
module top (....)
wire control_signal
ctrl c ( ip, control_signal)
A u1 ( x, y, z, control_signal)
B u2 ( x1,y1,z1, control_signal)
C u3 ( x2, y2, z2, control_signal)
D u4 (x3,y3,z3, control_signal)
endmodule
```
FIG._12

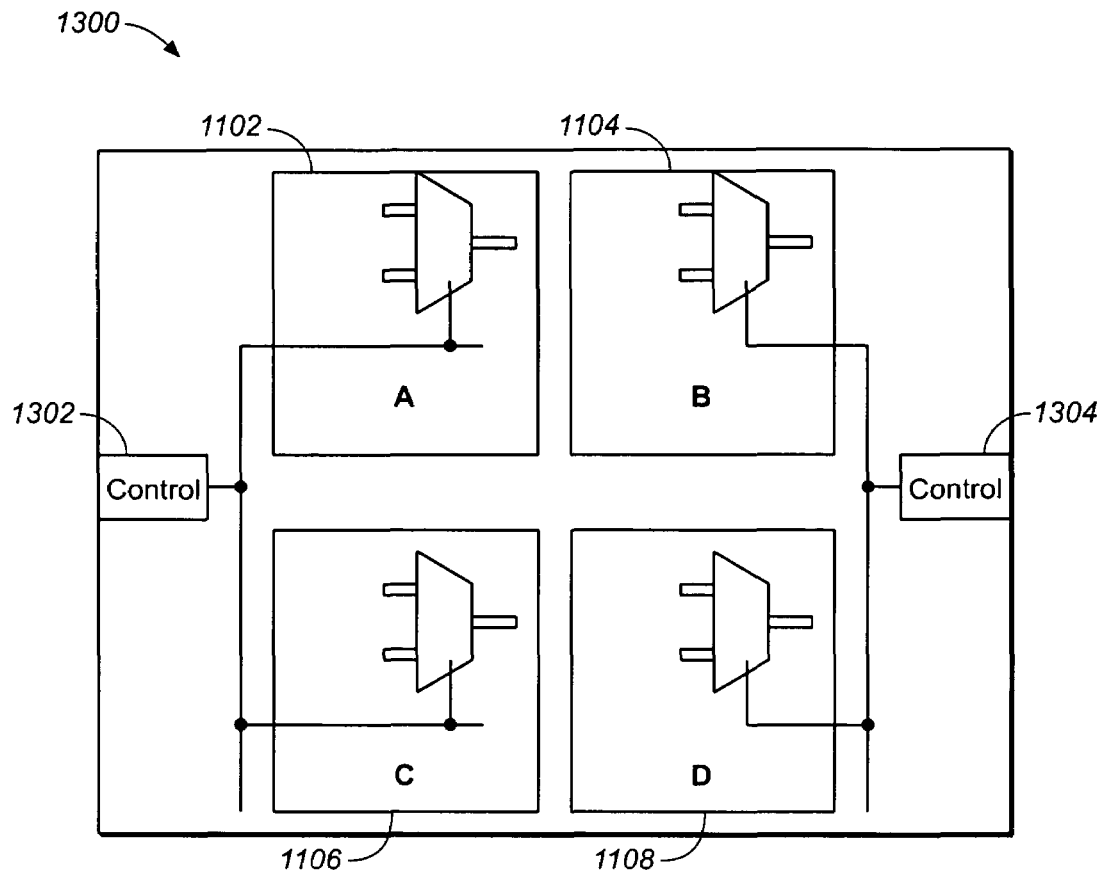
FIG._13
```
module top (....)
wire control_signal1, control_signal2
ctrl c1 ( ip, control_signal1 )
A u1 ( x, y, z, control_signal1 )
B u2 ( x1,y1,z1, control_signal1 )
ctrl c2 ( ip, control_signal2 )
C u3 ( x2, y2, z2, control_signal2)
D u4 (x3,y3,z3, control_signal2 )
endmodule
```
1400
FIG._14

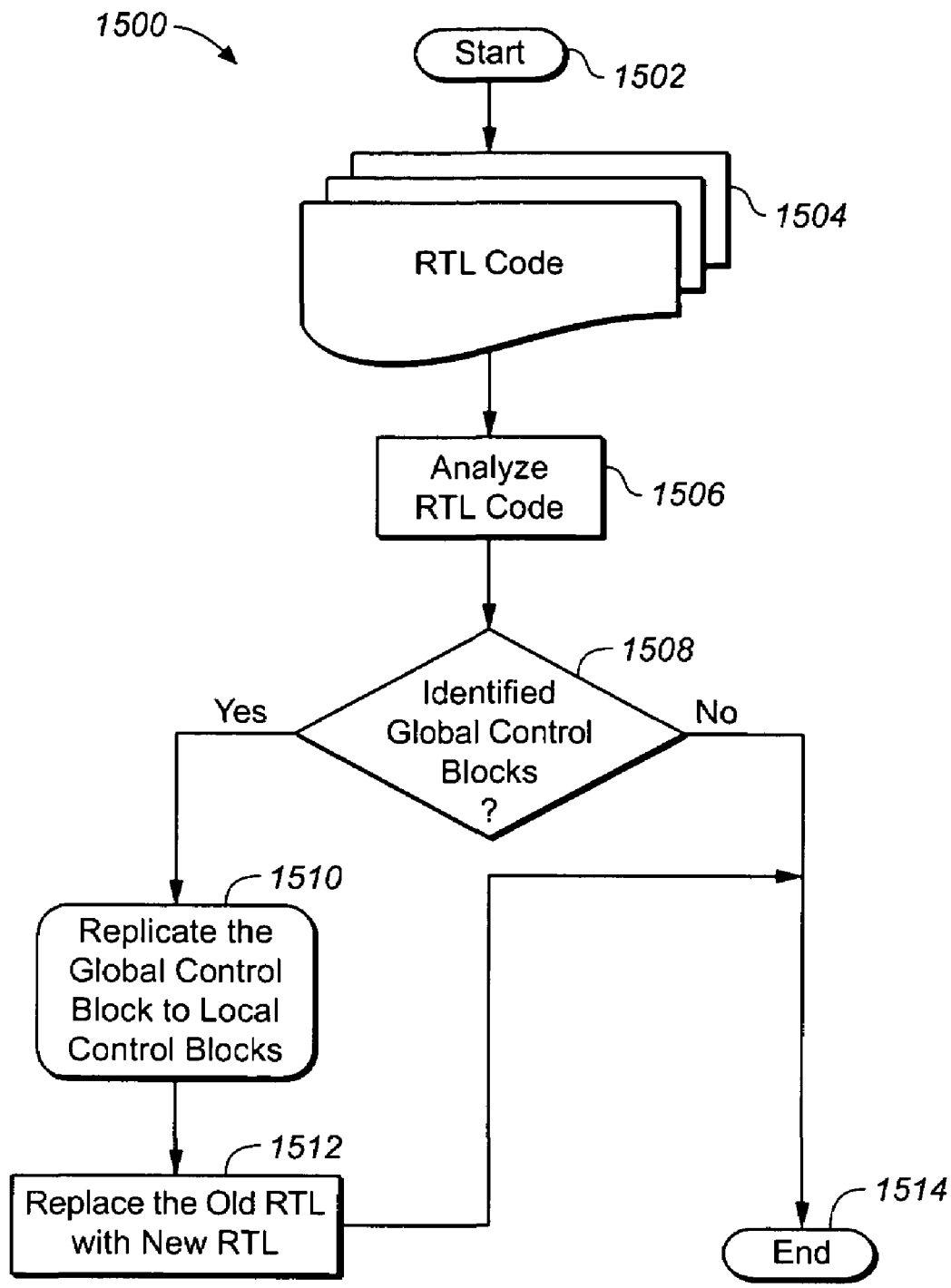
FIG._15

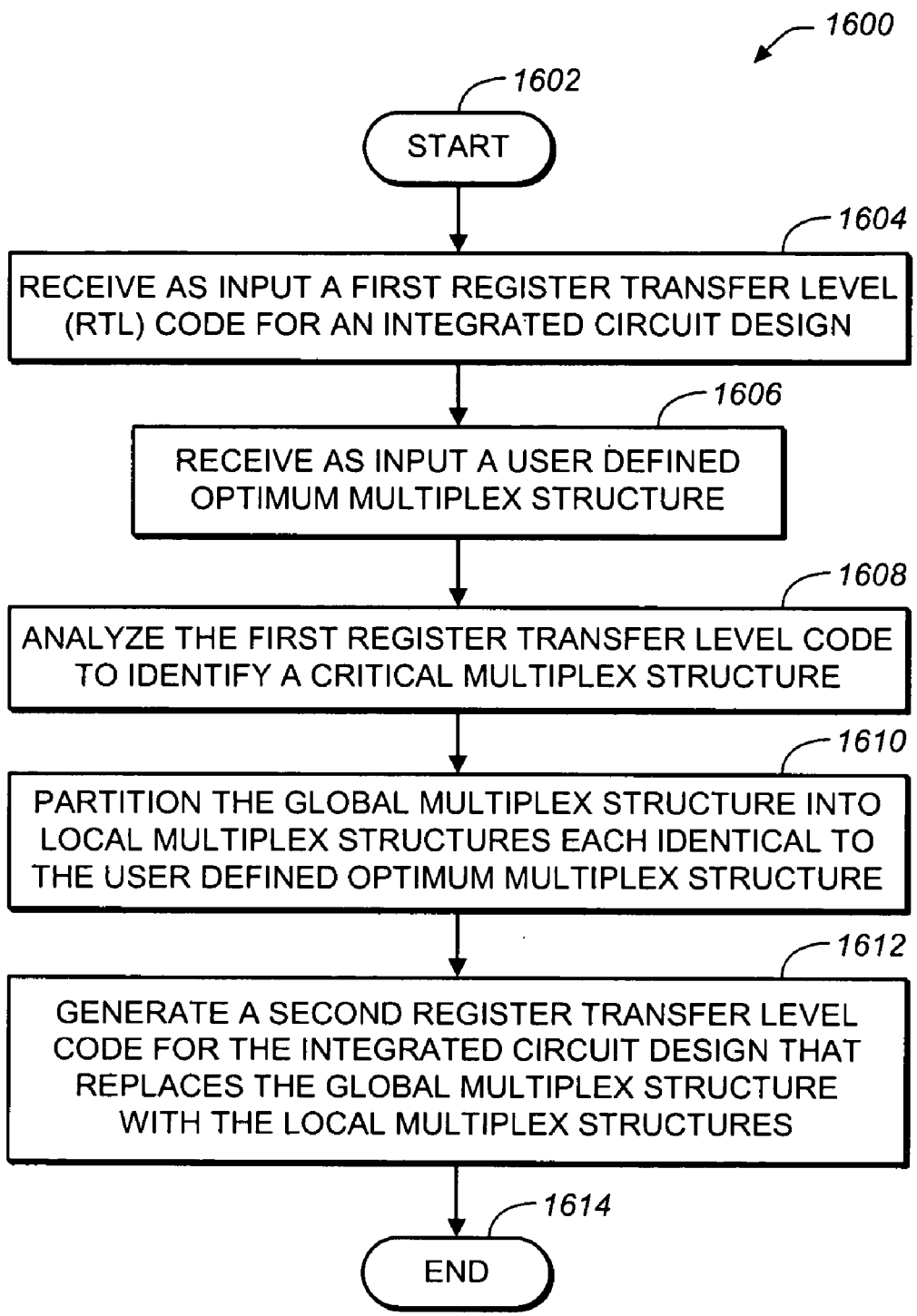
FIG._16

METHOD OF OPTIMIZING RTL CODE FOR MULTIPLEX STRUCTURES

BACKGROUND OF THE INVENTION

1. Field of the Invention

The present invention is directed to integrated circuit design software used in the manufacture of integrated circuits. More specifically, but without limitation thereto, the present invention is directed to avoiding timing and congestion problems in register transfer level (RTL) code for multiplex structures in an integrated circuit design.

2. Description of the Prior Art

Complex multiplex structures are one of the main causes of congestion problems in the layout of field programmable gate arrays (FPGAs), application specific integrated circuits (ASICs), and structured ASICs. In previous methods of checking for congestion problems, a netlist is generated for the integrated circuit design that is received as input by a layout tool to determine whether the netlist is routable. If not, then the RTL code is modified to relieve routing congestion and a new netlist is generated and checked, and so on until a routable netlist is generated.

SUMMARY OF THE INVENTION

In one embodiment of the present invention, a method of optimizing RTL code for an integrated circuit design includes steps of:
(a) receiving as input a first register transfer level code for an integrated circuit design;
(b) receiving as input a user defined optimum multiplex structure;
(c) analyzing the first register transfer level code to identify a critical multiplex structure;
(d) partitioning the global multiplex structure into local multiplex structures each identical to the user defined optimum multiplex structure; and
(e) generating as output a second register transfer level code for the integrated circuit design that replaces the global multiplex structure with the local multiplex structures.

In another aspect of the present invention, a computer program product for optimizing RTL code for an integrated circuit design includes a medium for embodying a computer program for input to a computer and a computer program embodied in the medium for causing the computer to perform steps of:
(a) receiving as input a first register transfer level code for an integrated circuit design;
(b) receiving as input a user defined optimum multiplex structure;
(c) analyzing the first register transfer level code to identify a critical multiplex structure;
(d) partitioning the global multiplex structure into local multiplex structures each identical to the user defined optimum multiplex structure; and
(e) generating as output a second register transfer level code for the integrated circuit design that replaces the global multiplex structure with the local multiplex structures.

DESCRIPTION OF THE DRAWINGS

The present invention is illustrated by way of example and not limitation in the accompanying figures, in which like references indicate similar elements throughout the several views of the drawings, and in which:

FIG. 4 illustrates an example of RTL code for the integrated circuit design of FIG. 3;

FIG. 5 illustrates a flow chart of a method of replacing global multiplex structures with local multiplex structures in RTL code for an integrated circuit design according to an embodiment of the present invention;

FIG. 6 illustrates an example of a control block design for multiplex structures according to an embodiment of the present invention;

FIG. 7 illustrates an example of RTL code for the control block design of FIG. 6;

FIG. 8 illustrates an example of a control block design modified to split the control block module of FIG. 6;

FIG. 9 illustrates an example of RTL code for the control block design of FIG. 8;

FIG. 10 illustrates a flow chart of a method of splitting a control block module and merging the control signals from the control blocks into modules containing multiplex structures in the RTL code of an integrated circuit design according to an embodiment of the present invention;

FIG. 11 illustrates an example of an integrated circuit design for identifying global control blocks according to an embodiment of the present invention;

FIG. 12 illustrates an example of RTL code for the integrated circuit design of FIG. 11;

FIG. 13 illustrates an example of an integrated circuit design modified from that of FIG. 11 to replace the global control block 1110 with local control blocks according to an embodiment of the present invention;

FIG. 14 illustrates an example of RTL code for replacing global control blocks with local control blocks according to an embodiment of the present invention;

FIG. 15 illustrates a flow chart of a method of replacing global control blocks with local control blocks according to an embodiment of the present invention; and FIG. 16 illustrates a flow chart of a method summarizing the steps for the method of FIG. 5.

Figure 1:
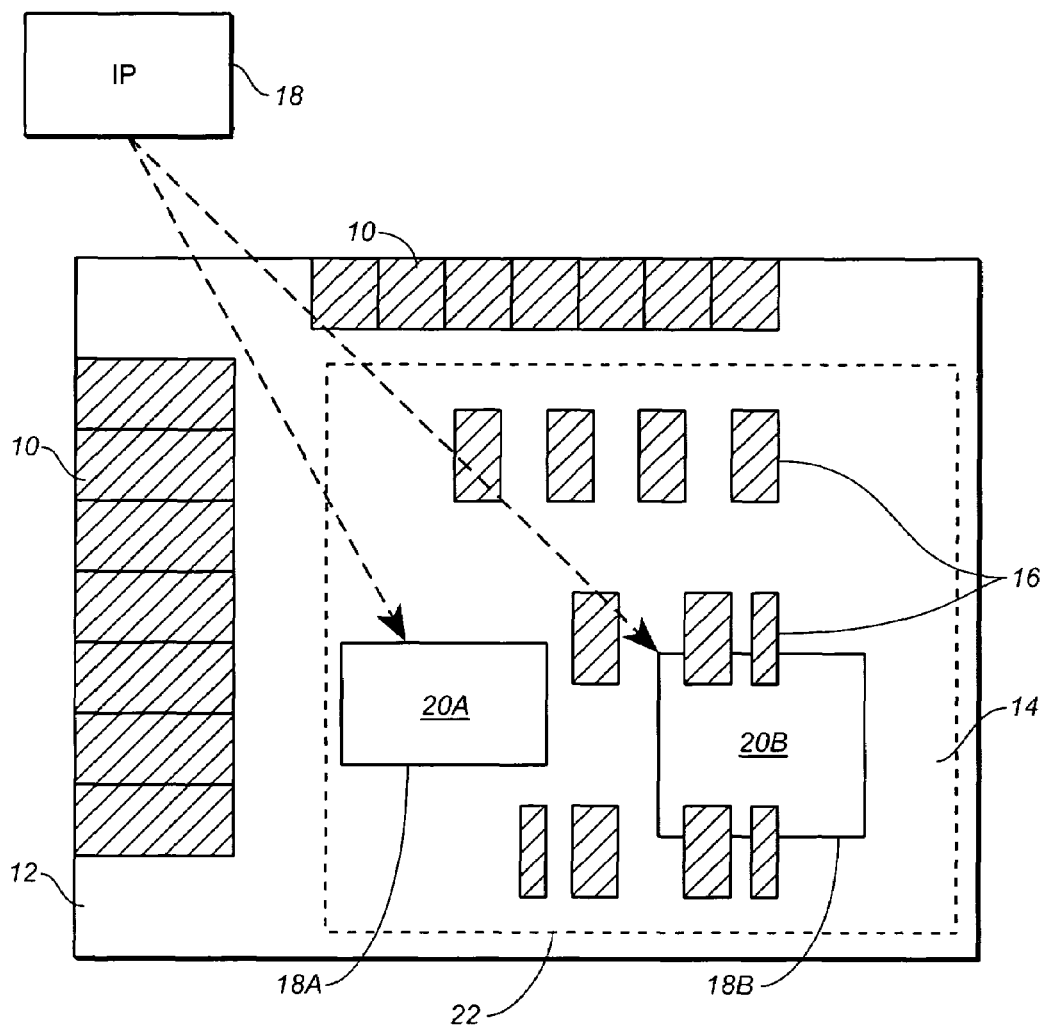
FIG. 1 illustrates an example of an integrated circuit design including a global multiplex structure according to an embodiment of the present invention.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

If not properly designed at the RTL code level, complex multiplex structures may significantly increase the turnaround time due to timing and routing congestion problems. In some cases, an integrated circuit design that includes a complex multiplex structure may be non-routable, in which case the product misses the market window and may ultimately be canceled, resulting in an expensive loss in valuable development time.

A critical multiplex structure is defined herein as any device connected to a total number of signal lines that exceeds a user defined threshold of the number of signal lines of an optimum multiplex structure. For example, if the user defined threshold is 48 signal lines for a 2-to-1 multiplexer having a 16-bit wide signal bus, then a 4-to-1 multiplexer having a 16-bit wide signal bus connected to four input signal buses and one output signal bus would have a total of 80 signal lines. The total number of 80 signal lines exceeds the user defined threshold of 48 signal lines of an optimum multiplex structure, therefore the 4-to-1 multiplexer is identified as a critical multiplex structure. The user defined optimum multiplexer size depends on the specific application as a function of the configuration, on the integrated circuit manufacturing technology as a function of the timing and possible cycle time, on the required performance as a function of the timing and cycle time, and on the physical implications, that is, the multiplexer must be routable in the layout and the timing requirements must be satisfied.

Anticipating routing congestion problems at the RTL code level in integrated circuit designs having critical multiplex structures is desirable to avoid the adverse impact of routing congestion later in the integrated circuit design cycle. Once a netlist has been generated, there is no direct correlation between the netlist and the RTL code. Any netlist analysis of multiplex structures is extremely limited if not impossible, because only individual net violations are generally reported. Often, thousands of net violations would have to be analyzed to determine that they are all from the same multiplex structure. Even if a critical multiplex structure could be identified, it would still be necessary to modify the RTL code manually, which may also be a resource and time intensive process.

An important feature of the present invention is that multiplex structures are analyzed at the RTL code level, and critical multiplex structures may be automatically replaced with optimized multiplex structures to avoid routing congestion in placement and floorplanning of the integrated circuit design.

In one embodiment of the present invention, a method of optimizing RTL code for an integrated circuit design includes steps of:

(a) receiving as input a first register transfer level code for an integrated circuit design;
(b) receiving as input a user defined optimum multiplex structure;
(c) analyzing the first register transfer level code to identify a critical multiplex structure;
(d) partitioning the global multiplex structure into local multiplex structures each identical to the user defined optimum multiplex structure; and
(e) generating as output a second register transfer level code for the integrated circuit design that replaces the global multiplex structure with the local multiplex structures.

FIG. 1 illustrates an example of an integrated circuit design 100 including a global multiplex structure according to an embodiment of the present invention. Shown in FIG. 100 are a module A 102, a module B 104, a module C 106, a module D 108, a global multiplex structure module E 110, and signal buses 112, 114, 116 and 118.

In FIG. 1, all four signal buses 112, 114, 116 and 118 are received as input by the global multiplex structure module E 110. If the number of lines in each of the signal buses 112, 114, 116 and 118 times the number of signal buses exceeds a user defined threshold, then the global multiplex structure module E 110 is identified as a critical multiplex structure, that is, the resulting routing congestion would likely render the integrated circuit design non-routable.

Figure 2:
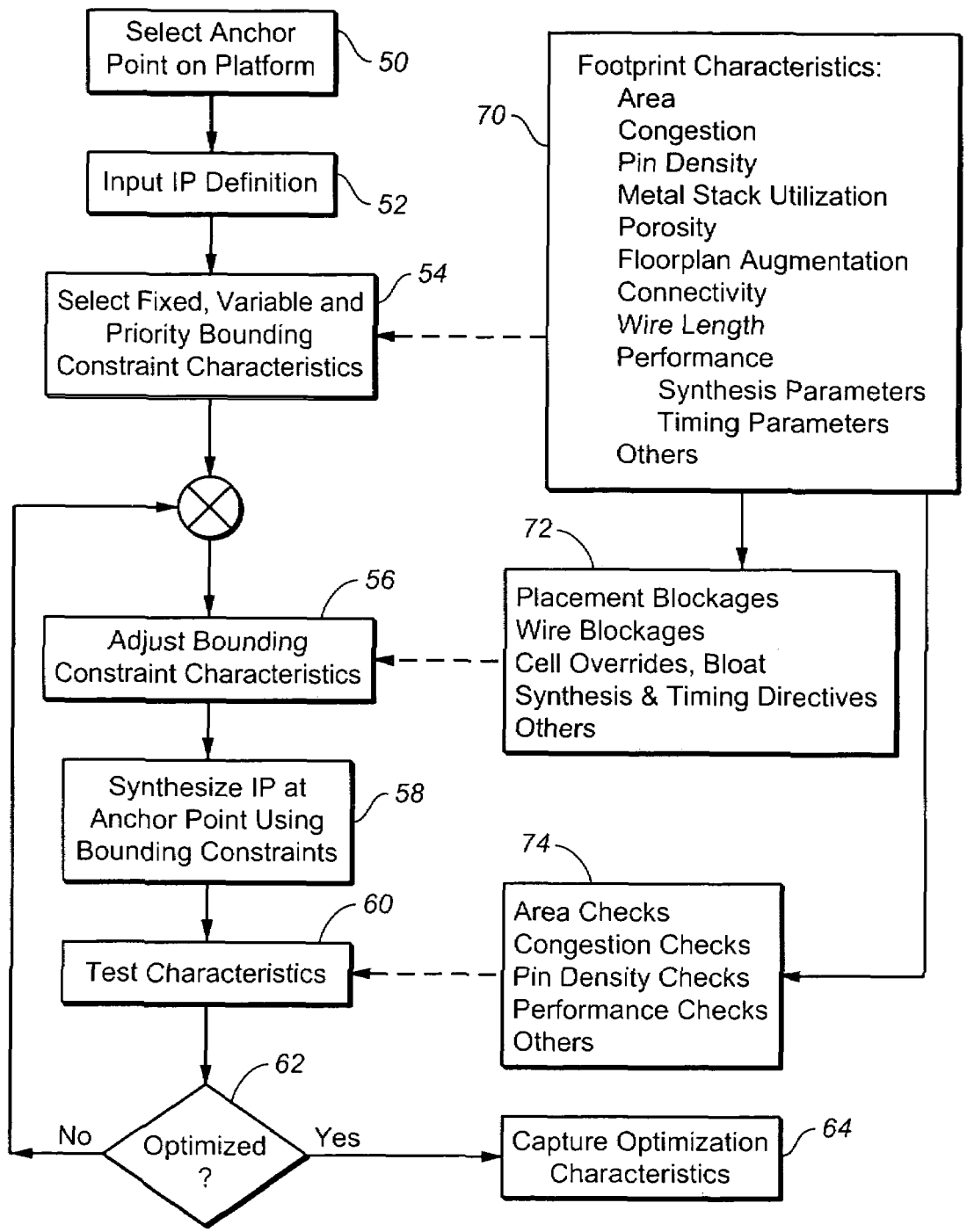
FIG. 2 illustrates an example of RTL code for the integrated circuit design of FIG. 1.

FIG. 2 illustrates an example of RTL code 200 for the integrated circuit design 100 of FIG. 1. The RTL code may be generated, for example, according to well-known techniques in the art of integrated circuit design.

The RTL code for the global multiplex structure module E 110 defines a 4-to-1 multiplexer having a 16-bit wide signal bus. The module A 102, the module B 104, the module C 106, and the module D 108 are each defined having a 16-bit wide bus that is connected to the global multiplex structure module E 110.

The RTL code is analyzed to identify critical multiplex structures. Multiplex structures may be found either manually or automatically in an RTL code. To find multiplex structures manually, the RTL code may be loaded by a text editor and searched for Verilog or VHDL constructs that describe a multiplex structure. Alternatively, multiplex structures may be found in the RTL code and reported automatically by commercially available software. Whether a multiplex structure is critical or not depends on the following three variables: the number of signal buses in the multiplex structure, the signal bus bit width, and the number of multiplex structures in the integrated circuit design. A set of tables may be compiled that includes these three variables to determine whether a multiplex structure is critical. The threshold values are based on, for example, a historical analysis of multiplex structures in designs to identify those that resulted in problems during layout, for example, routing congestion, timing problems, and problems related to test coverage and test vector generation. The historical information is used to determine the threshold values for critical multiplex structures in the RTL code.

After analyzing the RTL code, the global multiplex structure module E 110 is identified as a critical multiplex structure. The critical multiplex structure is replaced by a user defined optimum multiplex structure having fewer signal bus inputs to relieve routing congestion. To achieve the identical function performed by the original multiplex structure, additional optimum multiplex structures are inserted locally in the modules downstream from the first optimum multiplex structure. Preferably, the local optimum multiplex structures are inserted so that the overall bus length is minimized.

Figure 3:
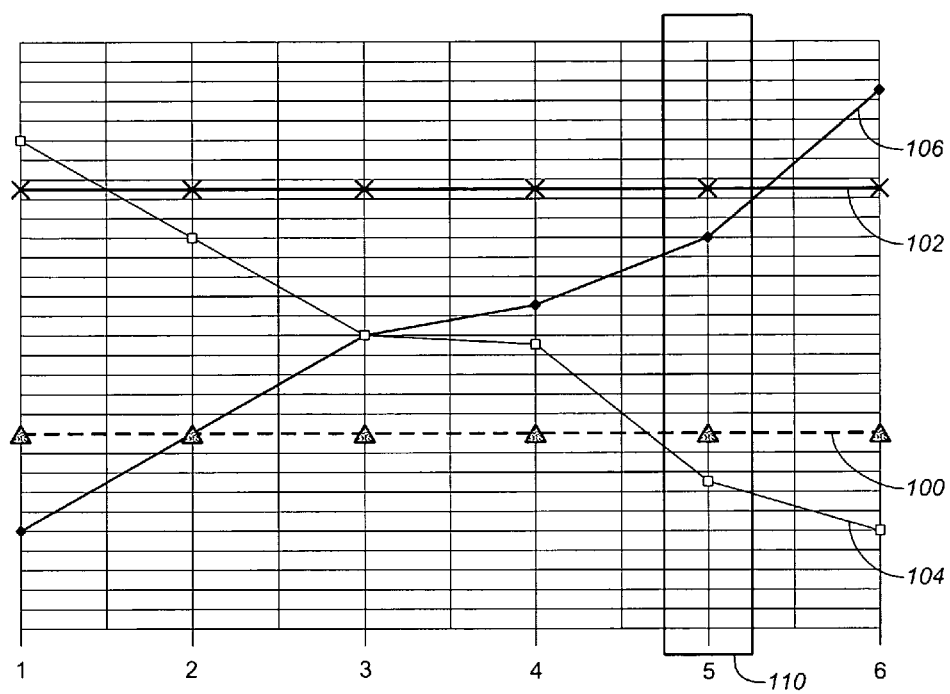
FIG. 3 illustrates an example of an integrated circuit design after replacing the global multiplex structure of FIG. 1 with local multiplex structures.

FIG. 3 illustrates an example of an integrated circuit design 300 after replacing the global multiplex structure of FIG. 1 with local multiplex structures. Shown in FIG. 300 are a module B 104, a module D 108, a module A 302, a module C 304, signal buses 114 and 116, an optimum multiplex structure module E 306, local multiplex structures 308 and 310, and rerouted signal buses 312 and 314.

In FIG. 3, the global multiplex structure module E 110 in FIG. 1 has been replaced by the optimum multiplex structure module E 306, and the module A 302 and the module C 304 have been modified from the module A 102 and the module C 106 in FIG. 1 to include the local multiplex structures 308 and 310. The optimum multiplex structure module E 306 and the local multiplex structures 308 and 310 may be, for example, identical user defined optimum multiplex structures. In this example, the user defined optimum multiplex structures are 2-to-1 multiplexers having a 16-bit wide signal bus. Also, the signal buses 112 and 118 have been replaced by the rerouted signal buses 312 and 314, and the local multiplex structures 308 and 310 are placed in the module A 302 and the module C 304 to minimize the overall signal bus length.

FIG. 4 illustrates an example of RTL code 400 for the integrated circuit design 300 of FIG. 3. The RTL code for the user defined optimum multiplex structure module E 306 defines a 2-to-1 multiplexer having a 16-bit wide bus. The module A 102, the module B 104, the module C 106, and the module D 108 are each defined having a 16-bit wide bus that is connected to the user defined optimum multiplex structure module E 306.

The RTL code 400 of FIG. 4 reduces the peak routing congestion from four 16-bit wide signal buses to two 16-bit wide signal buses, thereby avoiding routing congestion that might result in a non-routable floorplan.

FIG. 5 illustrates a flow chart 500 of a method of replacing global multiplex structures with local multiplex structures in RTL code for an integrated circuit design according to an embodiment of the present invention.

Step 502 is the entry point of the flow chart 500.

In step 504, the RTL code of an integrated circuit design is received as input.

In step 506, a user threshold defining an optimum multiplex structure is received as input.

In step 508, the RTL code is analyzed manually or automatically as described above to identify critical multiplex structures.

In step 510, if a critical multiplex structure is identified in the RTL code, then control is transferred to step 512. Otherwise, no changes to the RTL code are needed, and control is transferred to step 516.

In step 512, the critical multiplex structure is partitioned into local multiplex structures defined by the user threshold.

In step 514, the RTL code of the modified integrated circuit design is generated as output that incorporates the local multiplex structures.

Step 516 is the exit point of the flow chart 500.

The method of FIG. 5 may be used for hierarchical or flat integrated circuit layouts. In hierarchical designs, routing congestion problems may be advantageously avoided by the optimized design that may be more easily processed by synthesis and layout tools. In flat designs, RTL code may still be optimized to reduce synthesis and layout tool computer run time with improved results, for example, priority synthesis, place and route handling for optimized multiplex structures, in which a synthesis or layout tool processes the optimized structures first to achieve the best possible results.

The control blocks and signals that determine the state of the multiplex structures also play a key role in reducing timing problems and routing congestion in an integrated circuit design. After the RTL code has been optimized as described above with reference to FIG. 5, the RTL code may be further optimized to reduce timing problems and routing congestion due to the control blocks and signals as follows.

FIG. 6 illustrates an example of a control block design 600 for multiplex structures according to an embodiment of the present invention. Shown in FIG. 6 are a control block module 602, control blocks 604 and 606, a module A 608, and a module B 610.

In FIG. 6, the control blocks 604 and 606 that control the state of the multiplex structures in the module A 608 and the module B 610 are placed within the separate control block module 602.

FIG. 7 illustrates an example of RTL code 700 for the control block design 600 of FIG. 6. The RTL code may be generated, for example, according to well-known techniques in the art of integrated circuit design.

The RTL code for the control block module 602 includes the RTL code for the control blocks 604 and 606. If the number of control signals routed from the control block module 602 exceeds a threshold value determined by the number of control nets or pins per location or structure, then the control block module 602 may be split to merge the control blocks 604 and 606 into the module A 608 and the module B 610 as follows.

FIG. 8 illustrates an example of a control block design 800 modified to split the control block module 602 of FIG. 6. Shown in FIG. 8 are control blocks 604 and 606, a module A 802, and a module B 804.

In FIG. 8, the control blocks 604 and 606 have been merged into the module A 802 and the module B 804, thereby avoiding routing congestion resulting from the former control block module 602.

FIG. 9 illustrates an example of RTL code 900 for the control block design 800 of FIG. 8. The RTL code 900 is generated by modifying the RTL code 700 so that the control block 604 is placed in the module A 802, and the control block 606 is placed in the module B 804.

The RTL code 900 of FIG. 9 advantageously avoids the routing congestion from the control block module 602 in FIG. 6, thereby avoiding routing congestion that might result in a non-routable floorplan.

FIG. 10 illustrates a flow chart 1000 of a method of splitting a control block module and merging the control signals from the control blocks into modules containing multiplex structures in the RTL code of an integrated circuit design according to an embodiment of the present invention.

Step 1002 is the entry point of the flow chart 1000.

In step 1004, the RTL code of an integrated circuit design is received as input.

In step 1006, a user threshold defining a threshold value for a critical number of multiplex control signals is received as input.

In step 1008, the RTL code is analyzed to identify control block modules having a critical number of multiplex control signals.

In step 1010, if a control block module having a critical number of multiplex control signals is identified in the RTL code, then the control block is a critical control block, and control is transferred to step 1012. Otherwise, no changes to the RTL code are needed, and control is transferred to step 1018.

In step 1012, if the control block may be split based on connectivity, then control is transferred to step 1014. For example, referring to FIG. 6, if there are no net connections between the control logic 604 that controls the module A 608 or between the control logic 606 that controls the module B 608, then the control module 602 may be split as illustrated in FIG. 8. Otherwise, control is transferred to step 1018.

In step 1014, the control block module is split, and the control blocks that generate the multiplex control signals are incorporated respectively into the modules containing the corresponding multiplex structures.

In step 1016, the RTL code of the modified control block design is generated as output that merges the control blocks into the modules containing the corresponding multiplex structures.

Step 1018 is the exit point of the flow chart 1000.

The method of FIG. 10 may be used for hierarchical or flat integrated circuit layouts. In hierarchical designs, routing congestion problems may be advantageously avoided by the optimized design that may be more easily processed by synthesis and layout tools. In flat designs, RTL code may still be optimized to reduce synthesis and layout tool computer run time with improved results, for example, priority synthesis, place and route handling for optimized multiplex structures, in which a synthesis or layout tool processes the optimized structures first to achieve the best possible results.

Alternatively, routing congestion resulting from control signals at control blocks may be advantageously reduced by replacing global control blocks with local control blocks as follows.

FIG. 11 illustrates an example of an integrated circuit design 1100 for identifying global control blocks according to an embodiment of the present invention. Shown in FIG. 1100 are a module A 1102, a module B 1104, a module C 1106, a module D 1108, and a global control block 1110.

In FIG. 11, the control signals for the module A 1102, the module B 1104, the module C 1106, and the module D 1108 are all generated by the global control block 1110. As a result, there may be routing congestion at the global control block 1110.

FIG. 12 illustrates an example of RTL code 1200 for the integrated circuit design 1100 of FIG. 11. The RTL code may be generated, for example, according to well-known techniques in the art of integrated circuit design.

The RTL code 1200 for the integrated circuit design 1100 of FIG. 11 defines the number of control signals generated by the global control block 1110. If the number of control signals routed from the global control block 1110 exceeds a threshold value, then the global control block 1110 may be replaced by local control blocks to reduce routing congestion as follows.

FIG. 13 illustrates an example of an integrated circuit design 1300 modified from that of FIG. 11 to replace the global control block 1110 with local control blocks according to an embodiment of the present invention. Shown in FIG. 13 are a module A 1102, a module B 1104, a module C 1106, a module D 1108, and local control blocks 1302 and 1304.

In FIG. 13, the control signals for the module A 1102, the module B 1104, the module C 1106, and the module D 1108 are divided between the local control blocks 1302 and 1304 The local control blocks 1302 and 1304 may be, for example, identical replicas of the global control block 1110 in FIG. 11. The local control blocks 1302 and 1304 may be placed in the integrated circuit design 1300 to advantageously avoid routing congestion of the control signals inside the integrated circuit design 1300.

FIG. 14 illustrates an example of RTL code 1400 for replacing global control blocks with local control blocks according to an embodiment of the present invention. The RTL code 1400 is generated by modifying the RTL code 1200 so that the global control block 1110 is replaced by splitting the global control block 1110 into two local control blocks ctrl c1 and ctrl c2.

The RTL code 1400 of FIG. 14 advantageously avoids the routing congestion from the global control block 1110 in FIG. 11, thereby avoiding routing congestion that might result in a non-routable floorplan.

FIG. 15 illustrates a flow chart 1500 of a method of replacing global control blocks with local control blocks according to an embodiment of the present invention.

Step 1502 is the entry point of the flow chart 1500.

In step 1504, the RTL code of an integrated circuit design is received as input.

In step 1506, the RTL code is analyzed to identify global control blocks.

In step 1508, if a global control block is identified in the RTL code, then control is transferred to step 1510. Otherwise, no changes to the RTL code are needed, and control is transferred to step 1514.

In step 1510, the global control block is replaced with local control blocks in the integrated circuit design. Each local control block has a flip flop that receives the same clock signal to ensure that the control signals generated by the local control blocks are identical to that generated by the global control block replaced by the local control blocks.

In step 1512, the RTL code of the modified integrated circuit design is generated as output that replaces the global control blocks with the local control blocks.

Step 1514 is the exit point of the flow chart 1000.

The method of FIG. 15 may be used for hierarchical or flat integrated circuit layouts. In hierarchical designs, routing congestion problems may be advantageously avoided by the optimized design that may be more easily processed by synthesis and layout tools. In flat designs, RTL code may still be optimized to reduce synthesis and layout tool computer run time with improved results, for example, priority synthesis, place and route handling for optimized multiplex structures, in which a synthesis or layout tool processes the optimized structures first to achieve the best possible results.

In another embodiment of the present invention, a computer program product for optimizing RTL code for an integrated circuit design includes a medium for embodying a computer program for input to a computer and a computer program embodied in the medium for causing the computer to perform steps of:

(a) receiving as input a first register transfer level code for an integrated circuit design;

(b) receiving as input a user defined optimum multiplex structure;

(c) analyzing the first register transfer level code to identify a critical multiplex structure;

(d) partitioning the global multiplex structure into local multiplex structures each identical to the user defined optimum multiplex structure; and (e) generating as output a second register transfer level code for the integrated circuit design that replaces the global multiplex structure with the local multiplex structures.

FIG. 16 illustrates a flow chart 1600 of a method summarizing the steps for the method of FIG. 5.

Step 1602 is the entry point of the flow chart 600.

In step 1604, a first register transfer level code for an integrated circuit design is received as input.

In step 1606, a user defined optimum multiplex structure is received as input.

In step 1608, the first register transfer level code is analyzed to identify a critical multiplex structure.

In step 1610, the global multiplex structure is partitioned into local multiplex structures each identical to the user defined optimum multiplex structure.

In step 1612, a second register transfer level code is generated for the integrated circuit design that replaces the global multiplex structure with the local multiplex structures.

Step 1614 is the exit point of the flow chart 1600.

Although the method of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations could be made thereto by those skilled in the art without departing from the scope of the invention set forth in the following claims.

What is claimed is:

1. A method for optimizing register transfer level code for an integrated circuit design comprising steps of:

(a) receiving as input a first register transfer level code for the integrated circuit design;

(b) receiving as input a user defined optimum multiplex structure;
(c) analyzing the first register transfer level code to identify a global multiplex structure connected to a total number of signal lines that exceeds a user defined threshold of a number of signal lines in the user defined optimum multiplex structure;
(d) partitioning the global multiplex structure into local multiplex structures each identical to the user defined optimum multiplex structure;
(e) generating as output a second register transfer level code for the integrated circuit design that replaces the global multiplex structure with the local multiplex structures; and
(f) replacing a global control block with a plurality of local control blocks in the second register transfer level code.

2. The method of claim 1 wherein step (f) comprises steps of:
receiving as input a threshold value for a critical number of multiplex control signals;
analyzing the first register transfer level code to identify a global control block module; and
when the global control block module has a number of control signals that exceeds the threshold value, splitting the global control block module into a plurality of local control blocks and incorporating the plurality of local control blocks into modules in the second register transfer level code that contain multiplex structures controlled by the control signals.

3. The method of claim 1 wherein step (f) comprises steps of:
receiving as input a threshold value for a critical number of multiplex control signals;
analyzing the first register transfer level code to identify a global control block; and
when the global control block has a number of control signals that exceeds the threshold value, replacing the global control block with a plurality of local control blocks in the second register transfer level code.

4. A computer program product for optimizing register transfer level code for an integrated circuit design comprising a medium for embodying a computer program for input to a computer and a computer program embodied in the medium for causing the computer to perform steps of:

(a) receiving as input a first register transfer level code for the integrated circuit design;
(b) receiving as input a user defined optimum multiplex structure;
(c) analyzing the first register transfer level code to identify a global multiplex structure connected to a total number of signal lines that exceeds a user defined threshold of a number of signal lines in the user defined optimum multiplex structure;
(d) partitioning the global multiplex structure into local multiplex structures each identical to the user defined optimum multiplex structure;
(e) generating as output a second register transfer level code for the integrated circuit design that replaces the global multiplex structure with the local multiplex structures; and
(f) replacing a global control block with a plurality of local control blocks in the second register transfer level code.

5. The computer program product of claim 4 wherein step (f) comprises steps of:
receiving as input a threshold value for a critical number of multiplex control signals;
analyzing the first register transfer level code to identify a global control block module; and
when the global control block module has a number of control signals that exceeds the threshold value, splitting the global control block module into a plurality of local control blocks and incorporating the plurality of local control blocks into modules in the second register transfer level code tat contain multiplex structures controlled by the control signals.

6. The computer program product of claim 4 wherein step (f) comprises steps of:
receiving as input a threshold value for a critical number of multiplex control signals;
analyzing the first register transfer level code to identify a global control block; and
when the global control block has a number of control signals that exceeds the threshold value, replacing the global control block with a plurality of local control blocks in the second register transfer level code.

* * * * *